United States Patent [19]
Takeuchi et al.

[11] Patent Number: 6,118,685
[45] Date of Patent: Sep. 12, 2000

[54] OPTICAL DATA PROCESSING APPARATUS AND A METHOD OF PROVIDING AN OPTICAL DATA PROCESSING APPARATUS

[75] Inventors: Yoshinori Takeuchi, Tokyo; Hideo Kawai, Sagamihara; Asako Baba, Yamato, all of Japan

[73] Assignee: Matsushita Electric Industrial Co., Ltd., Osaka, Japan

[21] Appl. No.: 09/267,602

[22] Filed: Mar. 15, 1999

[30] Foreign Application Priority Data

Apr. 23, 1998 [JP] Japan .................................. 10-113148

[51] Int. Cl.⁷ .................................................. G11C 13/04
[52] U.S. Cl. ............................................ 365/127; 365/106
[58] Field of Search ..................................... 365/106, 126, 365/127, 96

[56] References Cited

U.S. PATENT DOCUMENTS 5,097,443  3/1992  Kaneko et al. ......................... 365/126

*Primary Examiner*—Terrell W. Fears
*Attorney, Agent, or Firm*—Pollock, Vande Sande & Amernick

[57] ABSTRACT

It includes: a substrate; a plurality of optical data processing units arranged in an array on the substrate, a super graphite sheet on LEDs of the optical processing units, and a glass substrate on the super graphite sheet. Each optical data processing unit includes an optical signal receiving circuit on the substrate for receiving an optical signal and generating a reception signal; a data processing circuit on the substrate for processing the reception signal and generating resultant data; a drive circuit and an LED on the substrate for emitting an output optical signal and heat in accordance with the resultant data. The super graphite sheet on the LED transmits and radiates the heat from the LEDs. The super graphite film is provided by sintering a high polymer sheet and has a high heat conductivity. The optical signal receiving circuit receives the optical signal through the glass substrate or through the substrate made of silicon of which thickness is reduced for providing transparency or in which a through hole is formed. An optical data processing system including a plurality of optical data processing apparatus are coupled directly or through a coupling optics or a coupling optical system.

33 Claims, 9 Drawing Sheets

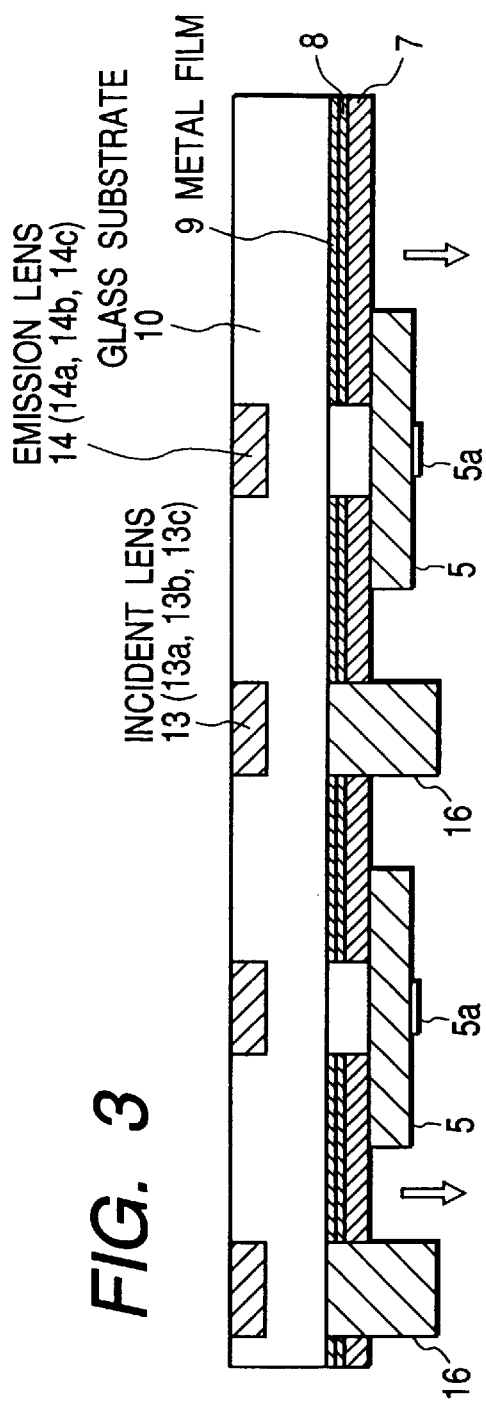
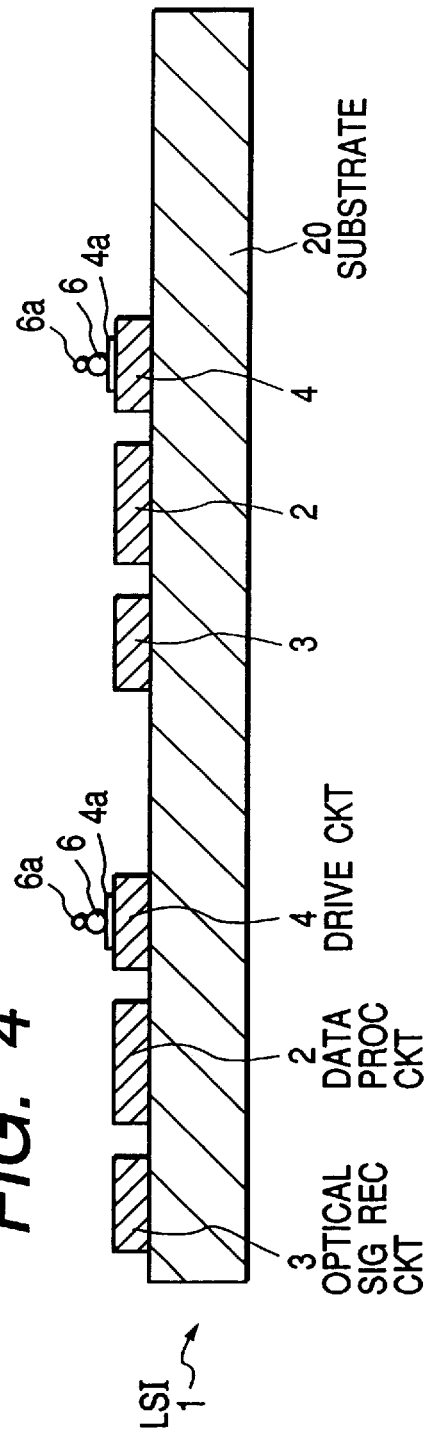

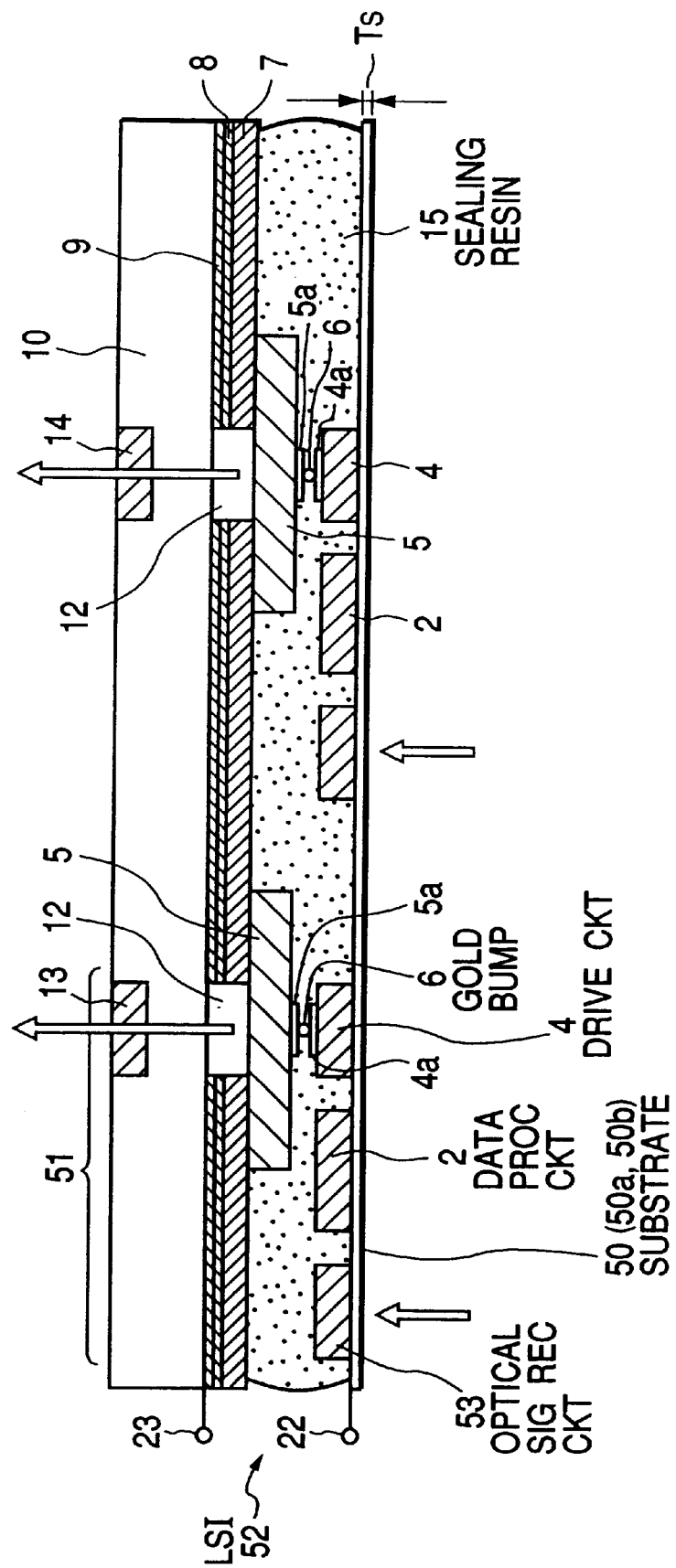

OPTICAL DATA PROCESSING APPARATUS AND A METHOD OF PROVIDING AN OPTICAL DATA PROCESSING APPARATUS

BACKGROUND OF THE INVENTION

1. Field of the Invention

This invention relates to an optical data processing apparatus for receiving and processing an optical signal and outputting an output optical signal and a method of an optical data processing apparatus.

2. Description of the Prior Art

An optical data processing apparatus including optical units arranged in an array for receiving an optical signal of two-dimensional data such as an image signal, each processing the received optical data and emitting an output optical signal indicative of the processing result is known. The size of the array is at least 16×16. If desired, the array size is 128×128 and the array is formed within a space of 50 mm×50 mm for example.

SUMMARY OF THE INVENTION

The aim of the present invention is to provide a superior optical data processing apparatus and a superior a method of providing an optical data processing apparatus.

According to the present invention there is provided a first optical data processing apparatus including: a substrate, a plurality of optical data processing units arranged in an array, and a heat transmitting sheet, each optical data processing unit including; an optical signal receiving circuit on the substrate for receiving an optical signal and generating a reception signal; a data processing circuit on the substrate for processing the reception signal and generating output data; and an optical signal emitting circuit on the substrate for emitting an output optical signal in accordance with the output data and generating heat, the heat transmitting sheet covering the optical signal emitting circuit of the optical data processing units for transmitting and radiating the heat.

In the first optical data processing apparatus, the heat transmitting sheet may include a graphite film having a heat conductivity along the graphite film more than 700 W/m•K.

In the first optical data processing apparatus, the heat transmitting sheet has a through hole for transmitting the output optical signal from each optical signal emitting circuit through the through hole.

In the first optical data processing apparatus, the heat transmitting sheet has a through hole for introducing the optical signal to each optical signal receiving circuit through the through hole.

In the first optical data processing apparatus, the graphite film has a thickness less than 150μ or less than 100μ.

According to the present invention there is provided a second optical data processing apparatus including: a transparent substrate; a heat transmitting sheet having N through holes arranged on the transparent substrate in an array for transmitting and radiating heat, N being a natural number more than one; N optical signal emitting circuits arranged on the heat transmitting sheet, an emitting portion of each optical signal emitting circuit being exposed to each of the through holes for emitting an output optical signal through the transparent substrate and each of the through holes in response to a drive signal and generating heat; an integrated circuit including: a substrate; N optical units on the substrate, each including: a signal receiving circuit on the substrate for receiving an optical signal and generating a reception signal; a data processing circuit for processing the reception signal and generating an output data; a driving circuit for generating the driving signal in accordance with the output data; and N bumps for electrically and mechanically connecting the driving circuits to the optical signal emitting circuits, respectively.

In the second optical data processing apparatus, the substrate includes a silicon substrate or a compound semiconductor substrate.

In the second optical data processing apparatus the transparent substrate includes N lens structures, each emitting the output optical signal. In this case, the lens structure includes a diffraction grating lens or a refractive index modulation lens.

In the second optical data processing apparatus, the transparent substrate includes N lens structures, each introducing the optical signal to each of the optical signal receiving circuit. In this case, each of the lens structures includes a diffraction grating lens or a refractive index modulation lens.

The second optical data processing apparatus may further include N optical passage elements correspondingly arranged with the N through holes, each of the optical passage elements transmitting the optical signal through the transparent substrate and each of the optical passage elements to the optical signal receiving circuit. In this case, the optical passage element includes a glass rod, an ultraviolet ray hardening resin, or an thermosetting resin.

In the second optical data processing apparatus, the substrate has a thickness less than 30 μm, 15 μm, or 5 μm.

In the second optical data processing apparatus, the substrate has N incident through holes, each introducing the optical signal.

In the second optical data processing apparatus, the heat transmitting sheet has N incident through holes, each introducing the optical signal to each of the optical signal receiving circuits through each of the incident through holes.

In the second optical data processing apparatus, the heat transmitting sheet includes a graphite film having a heat conductivity more than 700 W/m•K.

In the second optical data processing apparatus, the graphite film has a thickness less than 150μ, or less than 100μ.

According to the present invention there is provided a first method method of providing an optical data processing apparatus including the steps of: providing a substrate; forming an optical signal receiving circuit on the substrate receiving an optical signal; forming data processing circuit on the substrate processing the received optical signal and generating an resultant data; forming a drive circuit on the substrate having a first output terminal for outputting a drive signal in accordance with the resultant data at the first output terminal; forming a heat transmitting sheet for transmitting heat, wherein the heat transmitting and radiating sheet is formed by sintering a high polymer film in an inactive gas within a temperature range for graphitization; forming first and second through holes in the heat transmitting sheet; providing a transparent substrate; adhering the heat transmitting sheet on the transparent substrate; adhering an optical signal emitting circuit having a second output terminal to the heat transmitting sheet such that output optical signal from the optical signal emitting circuit transmits through the first through hole and the optical signal is received by the optical signal receiving circuit through the second through hole; forming a bump on the second output terminal; and adhering the bump to the second output terminal with an electrical conducting material.

According to this invention, there is provided a second method of providing an optical data processing apparatus including the steps of: providing a transparent substrate; providing a heat transmitting sheet on the transparent substrate, having a through hole, which transmits heat; forming an optical signal emitting circuit having a first terminal on the heat transmitting sheet which emits an output optical signal through the transparent substrate and the through hole in response to a drive signal; connecting an integrated circuit to the optical signal emitting circuit, the integrated circuit including: a substrate; an optical signal receiving circuit on the substrate which receives an optical signal; a data processing circuit for processing the optical signal and generating an resultant data; a driving circuit having a second terminal for generating the driving signal in accordance with the resultant data, wherein the integrated circuit is connected to the optical signal emitting circuit by flip chip bonding between the first and second terminals.

The second method of providing an optical data processing apparatus may further include the step of: polishing a surface of the substrate opposite to the optical signal receiving circuit to reduce a thickness of the substrate less than 30 μm.

In the second method of providing an optical data processing apparatus, the high polymer film may be processed by forming through holes therein for transmitting the output optical signal through the through hole before the high polymer film is sintered.

According to the present invention there is provided a third optical data processing apparatus including: a plurality of optical data processing units coupled each other, each optical data processing unit including: a substrate, a plurality of optical data processing elements arranged in an array, and a heat transmitting sheet, each optical data processing unit including; an optical signal receiving circuit on the substrate for receiving an optical signal and generating a reception signal; a data processing circuit on the substrate for processing the reception signal and generating output data; and an optical signal emitting circuit on the substrate for emitting an output optical signal and heat in accordance with the output data, the heat transmitting sheet being formed on the optical signal emitting circuits of the optical data processing units for transmitting the heat.

The second optical data processing apparatus may further include a coupling unit for coupling the optical data processing units each other.

BRIEF DESCRIPTION OF THE DRAWINGS

The object and features of the present invention will become more readily apparent from the following detailed description taken in conjunction with the accompanying drawings in which:

FIGS. 3 and 4 are side cross-sectional views of an optical data processing apparatus of the first embodiment under processing;

FIG. 5 is a side cross-sectional view of an optical data processing apparatus of a second embodiment;

The same or corresponding elements or parts are designated with like references throughout the drawings.

DETAILED DESCRIPTION OF THE INVENTION

<First Embodiment>

Figure 1:
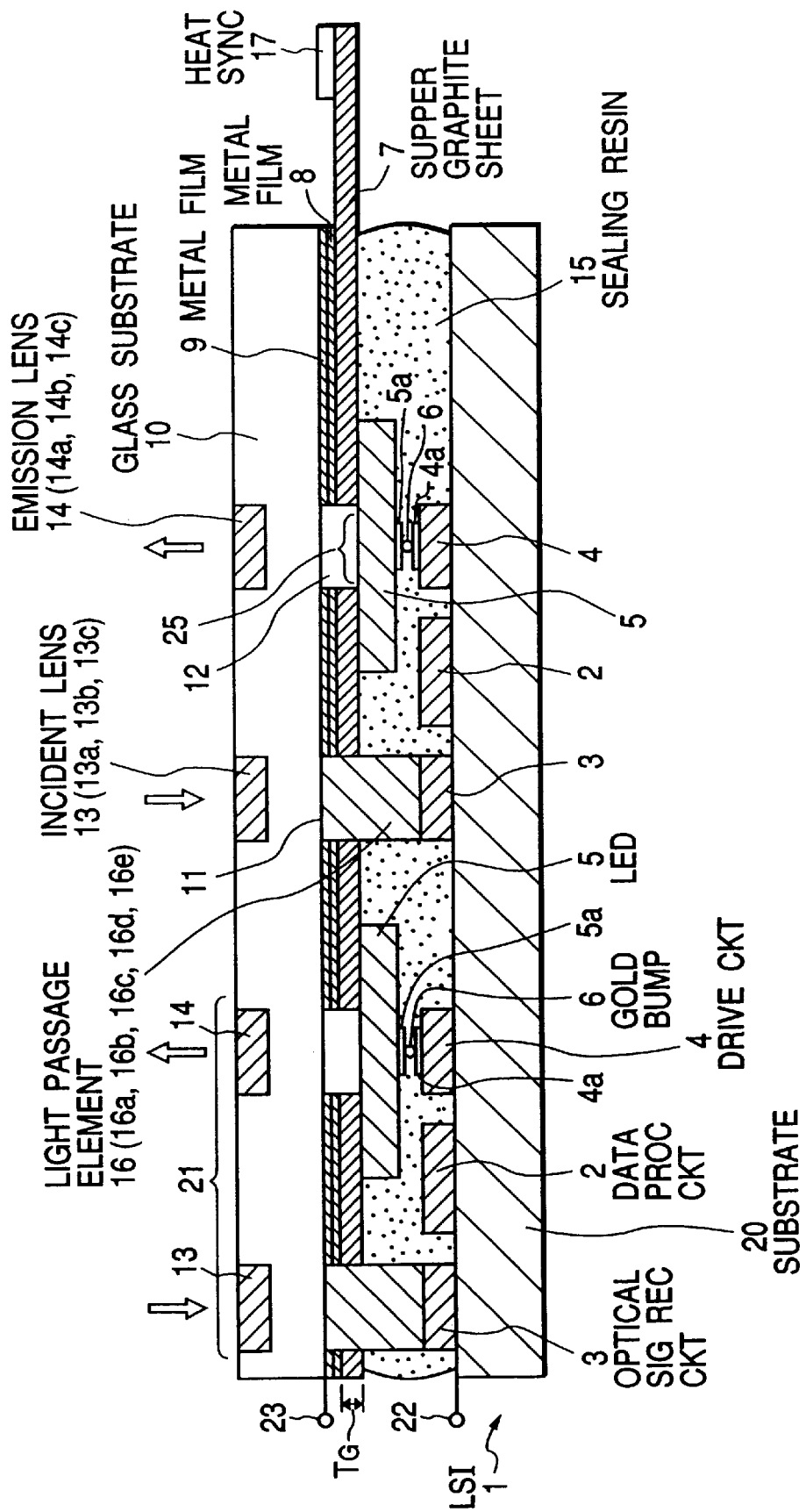
FIG. 1 is a side cross-sectional view of an optical data processing apparatus of a first embodiment.

FIG. 1 is a side cross-sectional view of an optical data processing apparatus of the first embodiment.

An large scale integrated circuit (LSI) 1 includes a plurality of optical units 21 two-dimensionally arranged (arranged in an array) on a substrate 20. Each optical unit 21 includes an optical signal receiving circuit 3 on the substrate 20 for receiving an optical signal and generating a reception signal, a data processing circuit 2 on the substrate 20 for processing the reception signal and generating resultant data, and an LED (light emission diode) driving circuit 4. Electrodes 5a of the LEDs 5 are electrically and mechanically connected to electrodes 4a of the driving circuits 4 of the LSI 1 by flip chip bonding with gold bumps 6, respectively. Instead the LEDs 5, surface emission lasers or electroluminescence elements can be used.

Figure 2A:
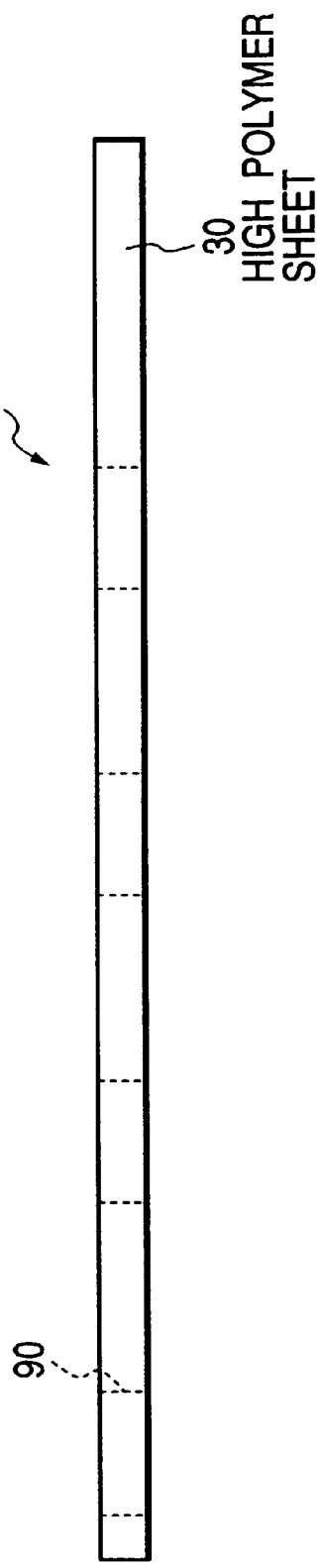
FIGS. 2A and 2B are side views of the first embodiment showing a processing providing the super graphite film.
Figure 2B:
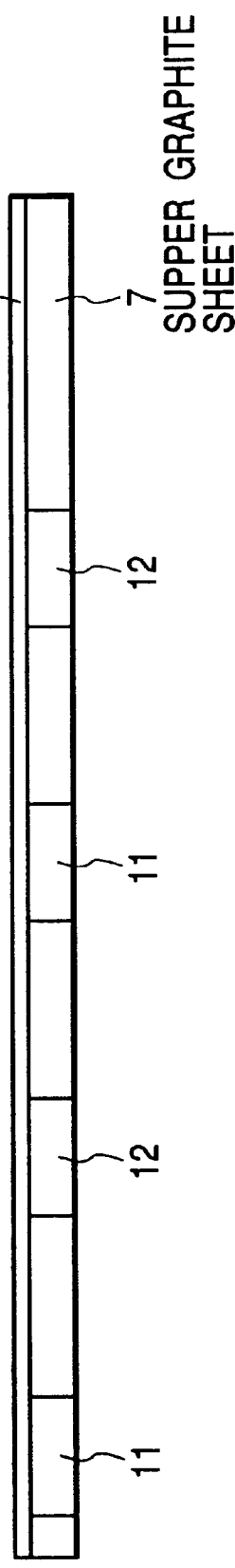

FIGS. 2A and 2B are side views of the first embodiment showing a processing providing the super graphite film 7.

The super graphite sheet 7 is formed by a heat processing such that a high polymer film 30 without holes 90 as a starting material is sintered in an inactive gas 40 at a temperature controlled within a temperature range for graphitization as shown in FIG. 2A. A heat conductivity of the super graphite sheet 7 is twice that of copper within the super graphite sheet 7. More specifically, the heat conductivity is more than 700 W/m•K and generally about 800 W/m•K. On the other hand, the heat conductivity in the vertical direction thereof (thickness direction) is relatively low. Therefore, the super graphite sheet 7 efficiently diffuses the heat along the super graphite sheet 7. That is, the super graphite sheet 7 has a high heat transmission function. A thickness of the super graphite sheet 7 does not largely affect the heat transmission function, so that a super graphite sheet 7 shows a sufficient radiation characteristic within a thickness less than 150 μm or 100 μm.

Then, on the super graphite sheet 7, a metal film 8 is formed by deposition as shown in FIG. 2B. As the metal for the metal film 8, Ni/Au is favorable. However, other metals can be used. The metal film 8 makes it easy to connect the super graphite sheet 7 to a transparent substrate 10 of which surface on the side of the super graphite sheet 7 is metallized with a metal as a metal film 9. That is, the glass substrate 10 is connected to the super graphite sheet 7 as shown FIGS. 3 and 4 with the metal films 8 and 9. Moreover, the metal films 8 and 9 act as a common electrode of the LEDs 5.

In the super graphite sheet 7, the metal films 8 and 9, incident through holes 11 and emitting through holes 12 are formed by the dry etching using hydrogen gas or the like, a charging processing, or a laser processing at the positions corresponding to the optical receiving circuits 3 and LEDs 5. Moreover, as shown in FIG. 2A, it is also possible that holes 90 are prepared in the high polymer sheet 30 as the starting material of the super graphite sheet 7 at the position corresponding to the position of the LEDs 5 and the optical receiving circuits 3 in advance and then, the high polymer sheet 30 is placed on the LEDs 5 and sintered.

Regarding the thickness of the super graphite sheet 7, if the thickness exceeds several hundreds μm, there will be problems that a distance of introducing the optical signal becomes large or it is difficult to form a through hole for introducing the optical signal. However, in this embodiment, the thickness TG of the super graphite sheet 7 is less than 150 μm and thus, the super graphite sheet 7 has a favorable heat radiation characteristic, so that the density of the optical processing units 21 per unit area can be increased.

A super graphite sheet 7 as a heat transmitting sheet is provided on the LEDs 5. The super graphite sheet 7 transmits the heat from the LEDs 5.

FIGS. 3 and 4 are side cross-sectional views of an optical data processing apparatus of the first embodiment under processing.

The transparent (glass) substrate 10 is made of quartz or glass which is transparent regarding the wavelengths of the optical signal to be received and the output optical signal. In the transparent substrate 10, incident lenses 13 at the positions corresponding to the optical receiving circuits 3, emission lenses 14 at the positions corresponding to the LEDs 5 are formed to increase a light incident efficiency and a light emission efficiency, respectively.

As the incident lens 13, a hologram optical element 13a, that is, refraction index modulation lens 13a, a diffraction grating lens 13b can be used. Moreover, a conventional convex optical lens 13c can be formed.

The hologram optical element 13a is provided by forming a fine structure having lens function on the surface of the transparent substrate 10. The fine structure provides the lens function by generating a phase difference in the rays passing therethrough by modulating refraction index or the like. This hologram optical element 13a is favorable in this embodiment because it is very thin and has a high degree of design freedom.

The diffraction grating lens 13b is formed by injecting ions in the glass substrate or by ion etching.

Similarly, as the emission lens 14, a hologram optical element 14a, that is, a refraction index modulation lens 14a, a diffraction grating lens 14b, or a conventional convex optical lens 14c can be used.

The LEDs 5 are adhered to the supper graphite sheet 7 and light passage elements 16 such as glass rods 16a are adhered to the glass substrate 10 as shown in FIG. 3.

On the electrodes 4a of the drive circuits 4 which are output terminals of the drive circuits 4, gold bumps 6 are formed. Then, a conductive adhesive 6a is coated on the gold bump 6 as shown in FIG. 4.

Then, the assembles shown in FIGS. 3 and 4 are connected to each other between the electrode 5a and the gold bumps 6 with the conductive adhesive 6a by flip chip bonding. If a material for preventing the electrode on the LSI1 from corrosion by solder is used, a solder bump can be used instead of the gold bump 6. Moreover, other flip chip bonding techniques such as a flip chip bonding using a tape showing conductivity by applying a pressure can be used also.

To provide a stable operation of the circuits, a sealing material 15 is filled in the space between two assembles shown in FIGS. 3 and 4. In this processing, it should be prevented that the light passage to the optical receiving circuit 3 and the light passage from the LED 5 are filled with the sealing resin 15. Then, the light passage elements 16 such as glass rods 16a are provided on the glass plate 10 at the positions corresponding to the receiving circuits 3 before the sealing material 15 is filled.

The glass rod 16a is extremely small, and it is difficult to deal with it. However, the glass rod 16a requires a minimum space, so that a density of the LEDs 5 per unit area can be increased. Instead the glass rod 16a, a galas ball lens can be used. In this case, the glass ball lens can be dealt with more easily than the case of the glass rod 16a. However, the space required by the glass ball lens is relatively large. Moreover, as the light passage element 16, a transparent ultraviolet hardening resin 16b and a transparent thermosetting resin 16c can be used. The transparent ultraviolet hardening resin 16b and the transparent thermosetting resin 16c are formed on the optical receiving circuit 3 and then hardened. This process is easier than the processing with the glass rod 16a and the glass ball. However, it is relatively difficult to control the shapes of the transparent ultraviolet hardening resin 16b and the transparent thermosetting resin 16c. Moreover, as the light passage element 16, an optical fiber 16d, and a optical fiber bundle 16e can be used.

Optical two-dimensionally modulated data is applied to the optical data processing apparatus of this embodiment. A portion of the optical two-dimensionally modulated data as an optical signal is collected by the indent lens 13 and enters the optical receiving circuit 3 through the light passage element 16 (incident through hole 11). The optical receiving circuit 3 receives the optical signal and generates an electric reception signal supplied to the data processing circuit 2. The data processing circuit 2 processes the reception signal from the optical receiving circuit 3 with communication with the neighbour data processing circuit 2 in accordance with the predetermined inputted command. The data processing result, i.e., resultant data is emitted by the LED 5 through the driving circuit 4 as output optical signal. The output optical signal is emitted toward the emission lens 14 through the emission hole 12. The emission lens 14 collimates the output optical signal and emits the optical signal collimated. Therefore, the optical data processing apparatus is capable of parallel data input and parallel data output with data processing.

The heat generated by the LED 5 with emission of the optical signal is transmitted through the super graphite sheet 7 and radiated by a heat sink 17, so that the data processing circuits 2, the driving circuits 4, and the LEDs 5 operate stable.

The LSI 1 and the LEDs 5 are connected to a power supply and to the ground through terminals 22 and 23.

<Second Embodiment>

FIG. 5 is a side cross-sectional view of an optical data processing apparatus of a second embodiment.

The optical data processing apparatus of the second embodiment has substantially the same structure as that of the first embodiment. The difference is that in an LSI 52, the optical signal receiving circuit 53 and the data processing circuit 2 is formed on a silicon substrate 50a or a compound semiconductor substrate 50b and the optical receiving circuit 53 receives the optical signal through the substrate 50. Therefore, the incident hole 11 and the light passage element 16 which existed in the first embodiment are omitted. Moreover, the thickness TS of the substrate 50 is reduced to receive and transmit the optical signal through the substrate 50.

Figure 6:
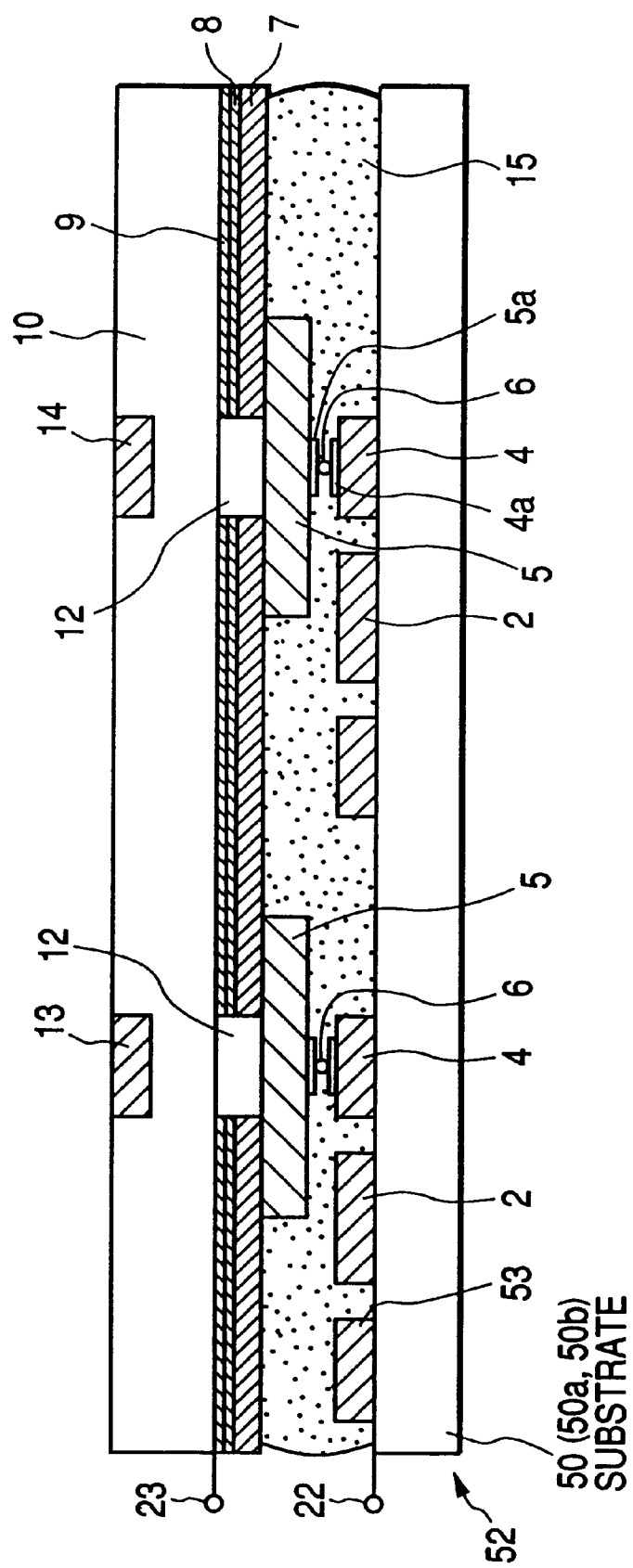
FIG. 6 is a side cross-sectional view of the optical data processing apparatus of the second embodiment before lapping.

FIG. 6 is a side cross-sectional view of the optical data processing apparatus of the second embodiment before lapping. The glass substrate 10 is connected to the LSI 52 and then, a surface of the substrate 50 opposite to the optical receiving circuit 53 and the data processing circuit 2 is lapped to reduce the thickness TS of the substrate 21 to 30 μm to 5 μm. The silicon substrate 50a absorbs the optical signal because its transparency is relatively low. However, reducing the thickness TS increases the transparency to a sufficient level.

Figure 7:
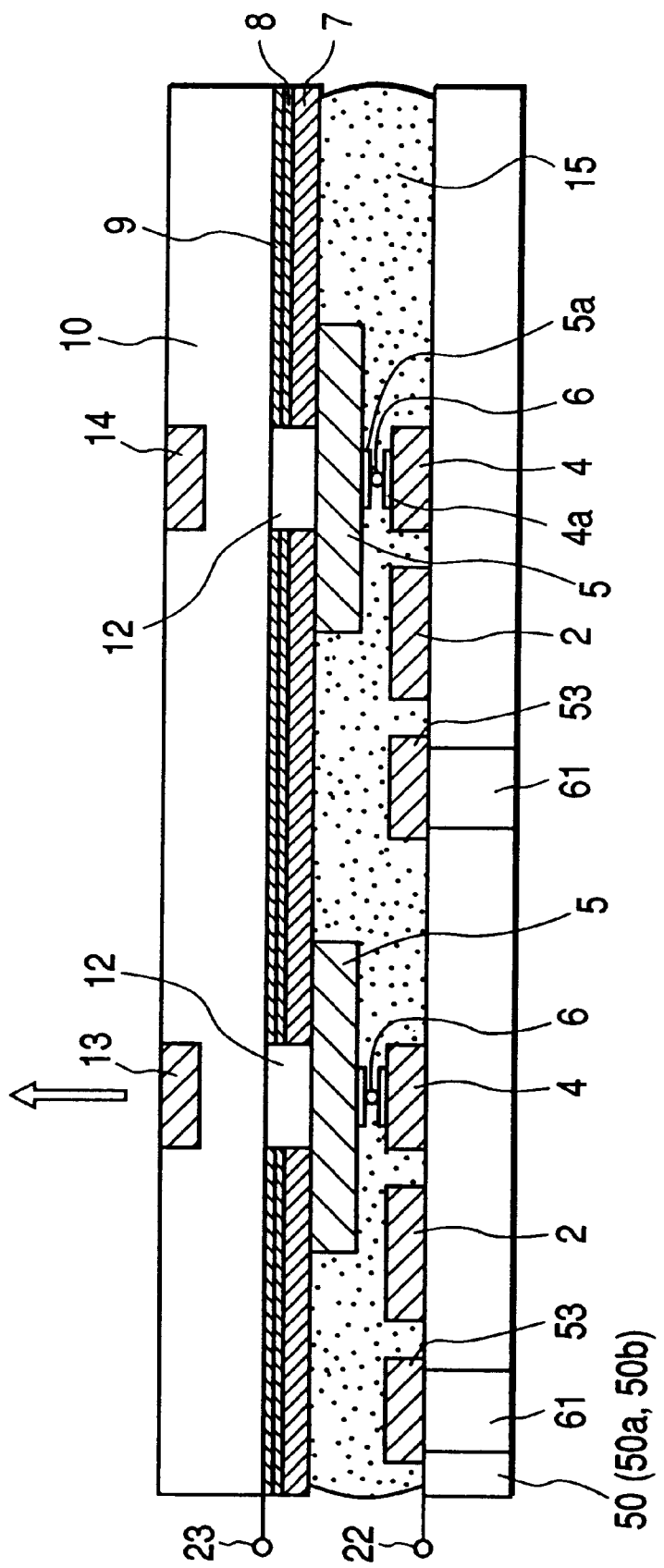
FIG. 7 is a side cross-sectional view of the optical data processing apparatus of a modification in the second embodiment.

FIG. 7 is a side cross-sectional view of the optical data processing apparatus of a modification. Instead lapping the substrate 50, through holes 61 for introducing the optical signals to the optical signal receiving circuits 53 are provided by dry etching or wet etching.

In this embodiment, the incident direction of the optical signal and an emission direction of the output optical signal are opposite to each other, so that it is easy to couple the LEDs 5 of one optical data processing apparatus to the optical receiving circuits 53 of another optical data processing apparatus.

<Third Embodiment>

Figure 8:
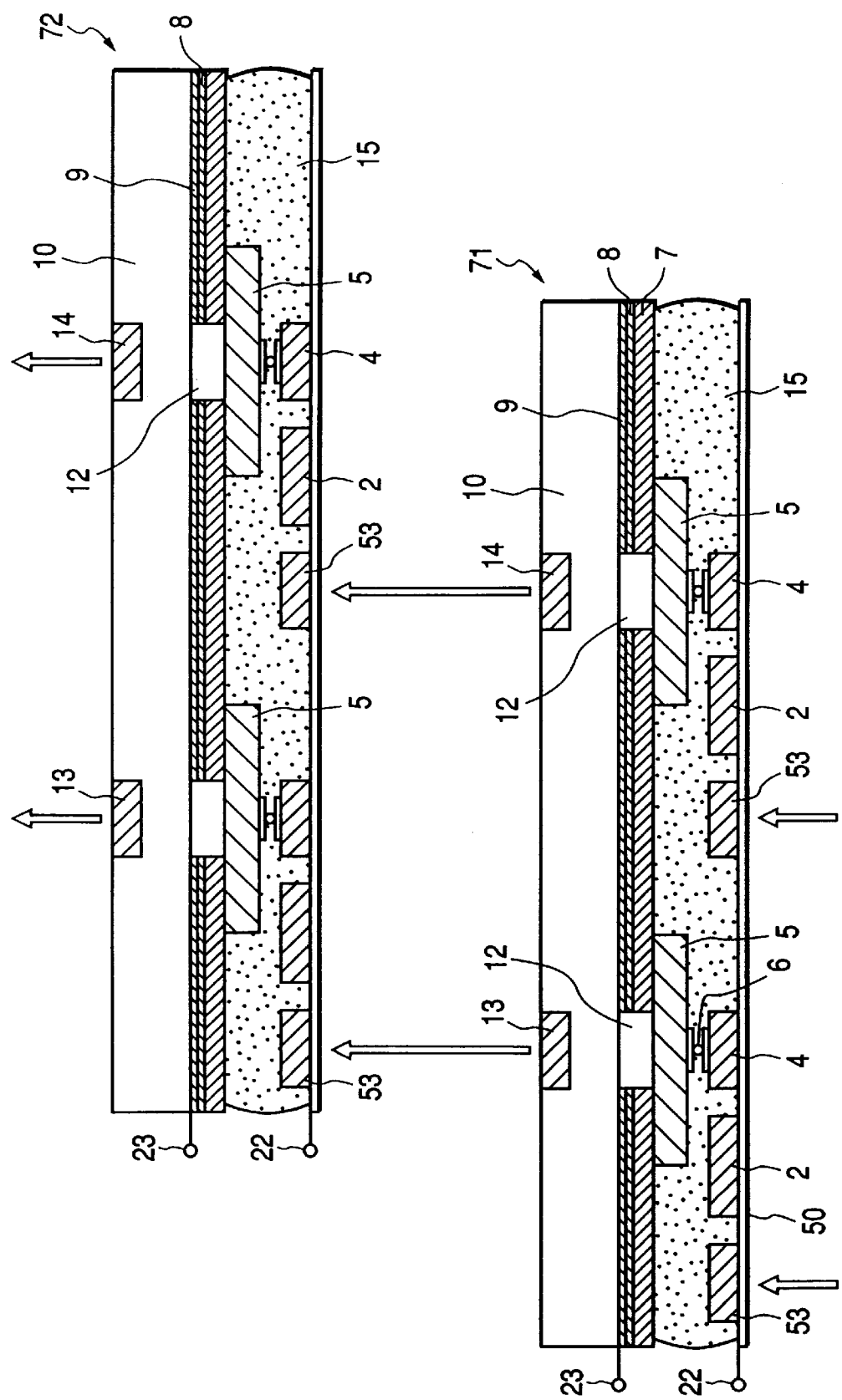
FIG. 8 is a side cross-sectional view of the optical data processing apparatus of a first example of a third embodiment.

FIG. 8 is a side cross-sectional view of the optical data processing apparatus of a first example of a third embodiment.

LEDs 5 of one optical data processing apparatus 71 of the second embodiment are coupled to the optical receiving circuits 53 of another optical data processing apparatus 72 of the second embodiment through the air.

Figure 9:
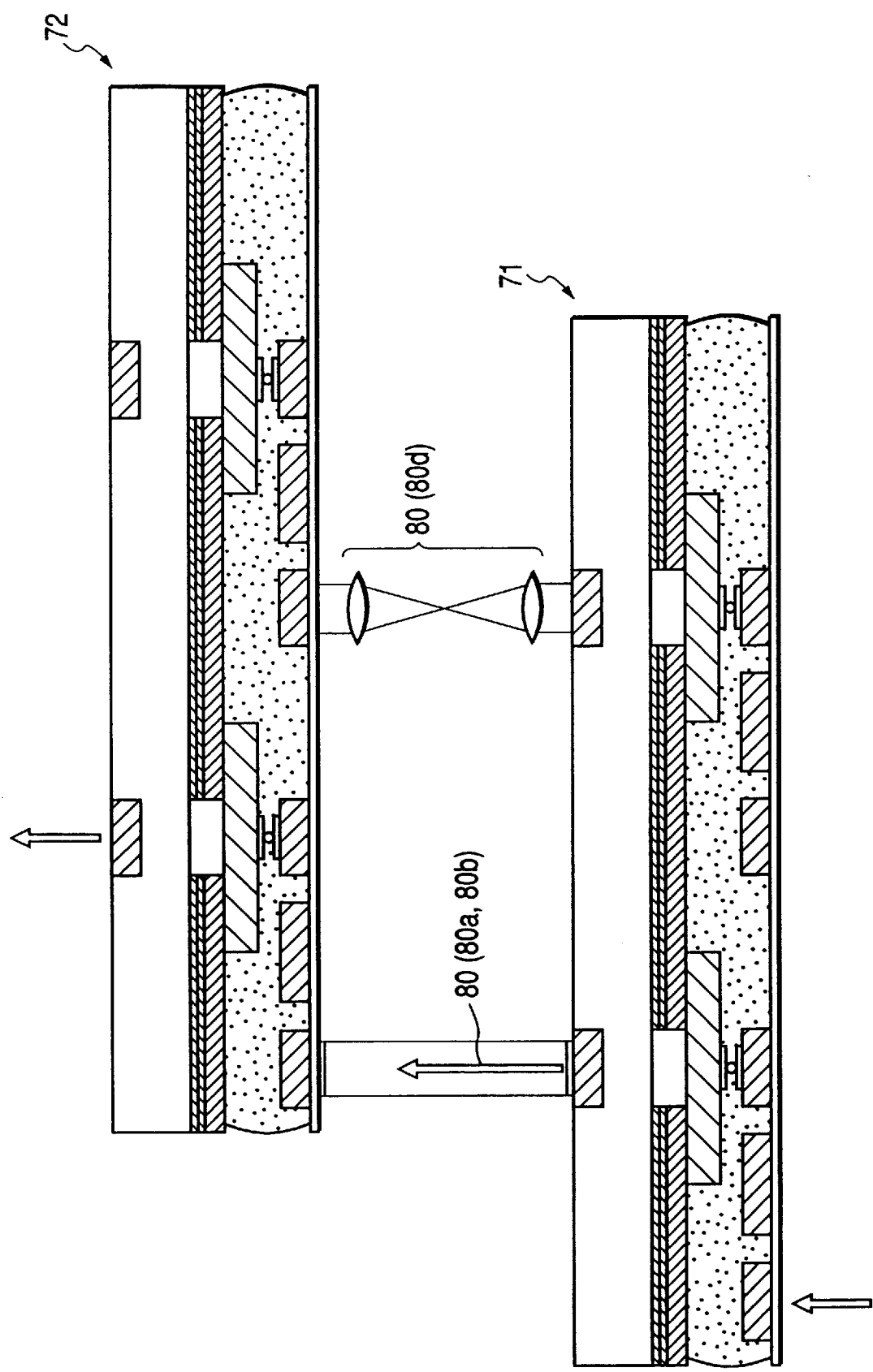
FIG. 9 is a side cross-sectional view of the optical data processing apparatus of a second example of the third embodiment.

FIG. 9 is a side cross-sectional view of the optical data processing apparatus of a second example of the third embodiment.

LEDs 5 of one optical data processing apparatus 71 of the second embodiment are coupled to the optical receiving circuits 53 of another optical data processing apparatus 72 of the second embodiment by a coupling element 80 such as an optical glass fiber 80a, a glass rod 80b and by a coupling element 80 such as a coupling optical system 80d including lenses.

Figure 10:
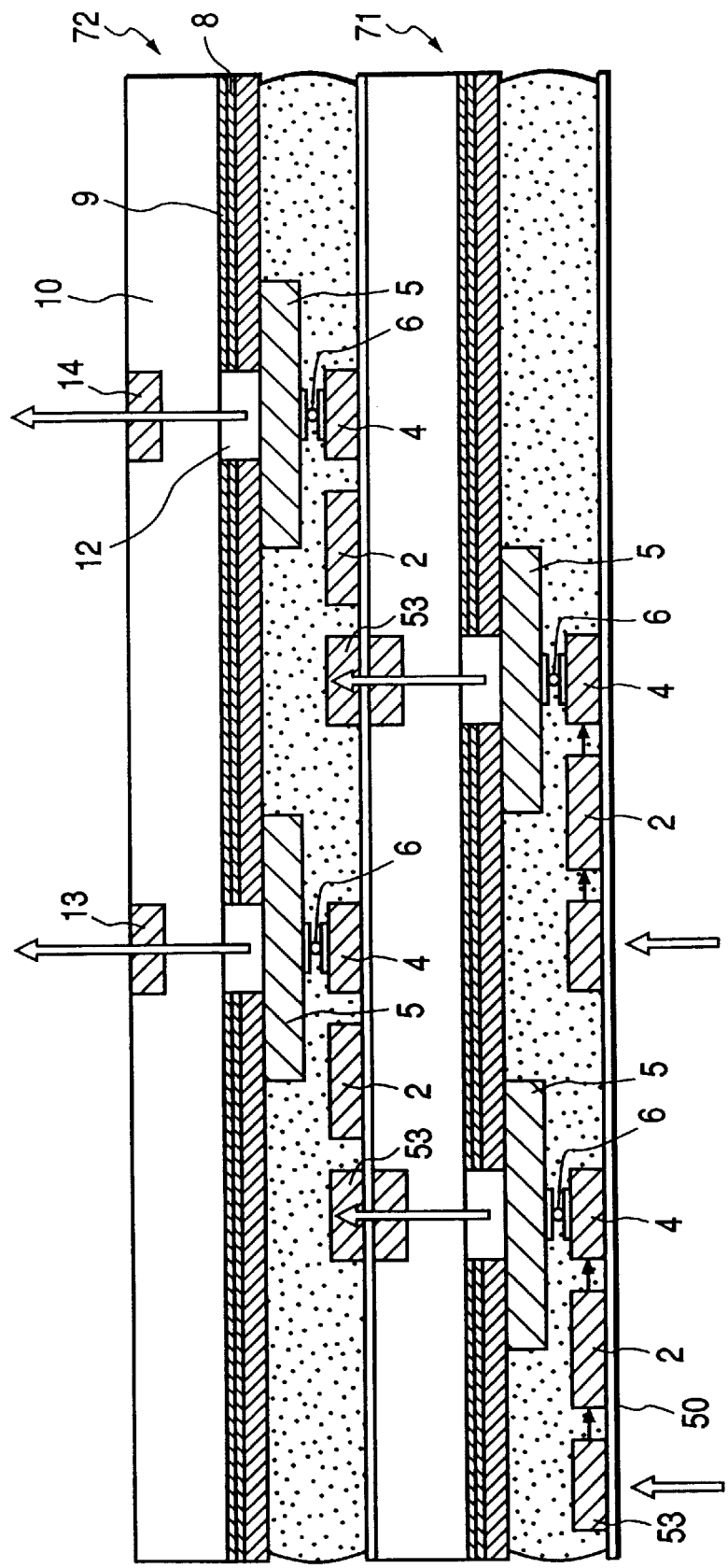
FIG. 10 is a side cross-sectional view of the optical data processing apparatus of a third example of the third embodiment.

FIG. 10 is a side cross-sectional view of the optical data processing apparatus of a third example of the third embodiment.

A second optical data processing apparatus 72 of the second embodiment is stacked on and connected to the first optical data processing apparatus 71 such that LEDs 5 of the first optical data processing apparatus 71 are directly coupled to the optical receiving circuits 53 of a second optical data processing apparatus 72 of the second embodiment.

What is claimed is:

1. An optical data processing apparatus comprising:
   a substrate, a plurality of optical data processing units arranged in an array, and a heat transmitting sheet, each optical data processing unit including;
      optical signal receiving means on said substrate for receiving an optical signal and generating a reception signal;
      data processing means on said substrate for processing said reception signal and generating resultant data; and
      optical signal emitting means on said substrate for emitting an output optical signal in accordance with said resultant data and generating heat, said heat transmitting sheet covering said optical signal emitting means of said optical data processing units for transmitting and radiating said heat.

2. The optical data processing apparatus as claimed in claim 1, wherein said heat transmitting sheet comprises a graphite film having a heat conductivity within said graphite film more than 700 W/m•K.

3. The optical data processing apparatus as claimed in claim 1, wherein said heat transmitting sheet has a through hole for transmitting said output optical signal from each of said optical signal emitting means through said through hole.

4. The optical data processing apparatus as claimed in claim 1, wherein said heat transmitting sheet has a through hole for introducing said optical signal to each of said optical signal receiving means through said through hole.

5. The optical data processing apparatus as claimed in claim 1, wherein said graphite film has a thickness less than 150μ.

6. The optical data processing apparatus as claimed in claim 5, wherein said graphite film has a thickness less than 100μ.

7. An optical data processing apparatus comprising:
   a transparent substrate;
   a heat transmitting sheet having N through holes arranged on said transparent substrate in an array for transmitting and radiating heat, N being a natural number more than one;
   N optical signal emitting means arranged on said heat transmitting sheet, an emitting portion of each optical signal emitting means being exposed to each of said through holes for emitting an output optical signal through said transparent substrate and each of said through holes in response to a drive signal and generating said heat;
   an integrated circuit including:
      a substrate;
      N optical units on said substrate, each including:
         signal receiving means on said substrate for receiving an optical signal and generating a reception signal;
         data processing means for processing said reception signal and generating resultant data;
         driving means for generating said driving signal in accordance with said resultant data; and
         means for electrically and mechanically connecting said driving means to said optical signal emitting means, respectively.

8. The optical data processing apparatus as claimed in claim 7, wherein said substrate comprises a silicon substrate.

9. The optical data processing apparatus as claimed in claim 7, wherein said substrate comprises a compound semiconductor substrate.

10. The optical data processing apparatus as claimed in claim 7, wherein said transparent substrate includes N lens structures, each emitting said output optical signal.

11. The optical data processing apparatus as claimed in claim 10, wherein said lens structure includes a diffraction grating lens.

12. The optical data processing apparatus as claimed in claim 10, wherein said lens structure includes a refractive index modulation lens.

13. The optical data processing apparatus as claimed in claim 7, wherein said transparent substrate includes N lens structures, each introducing said optical signal to each of said optical signal receiving means.

14. The optical data processing apparatus as claimed in claim 13, wherein each of said lens structures includes a diffraction grating lens.

15. The optical data processing apparatus as claimed in claim 13, wherein each of said lens structures includes a refractive index modulation lens.

16. The optical data processing apparatus as claimed in claim 7, further comprises N optical passage means correspondingly arranged with said N through holes, each of said optical passage means transmitting said optical signal through said transparent substrate and each of said optical passage means to said optical signal receiving means.

17. The optical data processing apparatus as claimed in claim 16, wherein said optical passage means comprises a glass rod.

18. The optical data processing apparatus as claimed in claim 16, wherein said optical passage means comprises an ultraviolet ray hardening resin.

19. The optical data processing apparatus as claimed in claim 16, wherein said optical passage means comprises an thermosetting resin.

20. The optical data processing apparatus as claimed in claim 7, wherein said substrate has a thickness less than 30 $\mu$m.

21. The optical data processing apparatus as claimed in claim 20, wherein said substrate has a thickness less than 15 $\mu$m.

22. The optical data processing apparatus as claimed in claim 21, wherein said substrate has a thickness equal to or less than 5 $\mu$m.

23. The optical data processing apparatus as claimed in claim 7, wherein said substrate has N incident through holes, each introducing said optical signal.

24. The optical data processing apparatus as claimed in claim 7, wherein said heat transmitting sheet has N incident through holes, each introducing said optical signal to each of said optical signal receiving means through each of said incident through holes.

25. The optical data processing apparatus as claimed in claim 7, wherein said heat transmitting sheet comprises a graphite film having a heat conductivity along said graphite film more than 700 W/m•K.

26. The optical data processing apparatus as claimed in claim 7, wherein said graphite film has a thickness less than 150$\mu$.

27. The optical data processing apparatus as claimed in claim 26, wherein said graphite film has a thickness less than 100$\mu$.

28. A method of providing an optical data processing apparatus comprising the steps of:
providing a substrate;
forming an optical signal receiving circuit on said substrate receiving an optical signal;
forming data processing circuit on said substrate processing the received optical signal and generating an resultant data;
forming a drive circuit on said substrate having a first output terminal for outputting a drive signal in accordance with said resultant data at said first output terminal;
forming a heat transmitting sheet transmitting heat, wherein said heat transmitting and radiating sheet is formed by sintering a high polymer film in an inactive gas within a temperature range for graphitization;
forming first and second through holes in said heat transmitting sheet;
providing a transparent substrate;
adhering said heat transmitting sheet on said transparent substrate;
adhering an optical signal emitting circuit having a second output terminal to said heat transmitting sheet such that output optical signal from said optical signal emitting circuit transmits through said first through hole and said optical signal is received by said optical signal receiving circuit through said second through hole; and
adhering a bump with a conductive material to said second output terminal.

29. A method of providing an optical data processing apparatus comprising the steps of:
providing a transparent substrate;
providing heat transmitting sheet on said transparent substrate, having a through hole, which transmits heat;
forming an optical signal emitting circuit having a first terminal on said heat transmitting sheet which emits an output optical signal through said transparent substrate and said through hole in response to a drive signal;
connecting an integrated circuit to said optical signal emitting circuit, said integrated circuit including:
a substrate;
an optical signal receiving circuit on said substrate which receives an optical signal;
a data processing circuit for processing said optical signal and generating an resultant data;
a driving circuit having a second terminal for generating said driving signal in accordance with said resultant data, wherein said integrated circuit is connected to said optical signal emitting circuit by flip chip bonding between said first and second terminals.

30. The method of providing an optical data processing apparatus as claimed in claim 29, further comprising the step of:
polishing a surface of said substrate opposite to said optical signal receiving circuit to reduce a thickness of said substrate less than 30 $\mu$m.

31. The method of providing an optical data processing apparatus as claimed in claim 30, wherein said high polymer film is processed by forming through holes therein for transmitting said output optical signal through said through hole before said high polymer film is sinterd.

32. An optical data processing apparatus comprising:
a plurality of optical data processing units coupled to each other, each optical data processing unit comprising:
a substrate, a plurality of optical data processing elements arranged in an array, and a heat transmitting sheet, each optical data processing unit including;
optical signal receiving means on said substrate for receiving an optical signal and generating a reception signal;
data processing means on said substrate for processing said reception signal and generating resultant data; and
optical signal emitting means on said substrate for emitting an output optical signal in accordance with said resultant data and generating heat, said heat transmitting sheet covering said optical signal emitting means of said optical data processing units for transmitting said heat.

33. The optical data processing apparatus as claimed in claim 32, further comprising: coupling means for coupling said optical data processing units to each other.

* * * * *